United States Patent
Ko et al.

(10) Patent No.: US 6,797,561 B2
(45) Date of Patent: Sep. 28, 2004

(54) METHOD OF FABRICATING A CAPACITOR OF A SEMICONDUCTOR DEVICE

(75) Inventors: Chang Hyun Ko, Seoul (KR); Young Sub You, Pyeongtaek-si (KR); Jai Dong Lee, Yongin-si (KR); Ki Hyun Hwang, Yongin-si (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 205 days.

(21) Appl. No.: 10/406,201

(22) Filed: Apr. 4, 2003

(65) Prior Publication Data

US 2003/0190782 A1 Oct. 9, 2003

(30) Foreign Application Priority Data

Apr. 4, 2002 (KR) ................................ 10-2002-0018447

(51) Int. Cl.⁷ .......................................... H01L 21/8242
(52) U.S. Cl. ...................... 438/240; 438/381
(58) Field of Search ............................... 438/238–241, 438/253–256, 381, 393–396

(56) References Cited

U.S. PATENT DOCUMENTS 6,303,502 B1 * 10/2001 Hsu et al. .................. 438/680

FOREIGN PATENT DOCUMENTS

KR    10-1999-0025462     1/2001

* cited by examiner

Primary Examiner—H. Jey Tsai
(74) Attorney, Agent, or Firm—Lee & Sterba, P.C.

(57) ABSTRACT

A method of fabricating a capacitor of a semiconductor device, includes forming a lower electrode on a semiconductor substrate, sequentially forming an aluminum oxide layer and a titanium oxide layer on the lower electrode, and forming an upper electrode on the titanium oxide layer, wherein the upper electrode crosses over the lower electrode. The titanium oxide layer is formed to have a thickness in a range of from about 2 Å to about 50 Å, and the upper electrode is formed at a temperature in a range of from about 150° C. to about 630° C. The temperature at which the upper electrode is formed is decreased as the thickness of the titanium oxide layer is increased to produce a capacitor of a semiconductor device having a minimized leakage current characteristic.

18 Claims, 10 Drawing Sheets

Fig. 1

(Prior Art)

Fig. 2

(Prior Art)

METHOD OF FABRICATING A CAPACITOR OF A SEMICONDUCTOR DEVICE

BACKGROUND OF THE INVENTION

1. Field of the Invention

The present invention relates to a method of fabricating a semiconductor device. More particularly, the present invention relates to a method of fabricating a capacitor of a semiconductor device having a dielectric layer consisting of a sequentially stacked aluminum oxide layer and a titanium oxide layer.

2. Description of the Related Art

As semiconductor devices become more highly integrated, the planar area occupied by capacitors of the semiconductor devices decreases. As is well known in the art, the capacitance of a capacitor is proportional to the dielectric constant of the dielectric layer thereof and the area of the electrodes of the capacitor. Accordingly, reducing the area of a capacitor to accommodate high integration results in a reduction in the capacitance of the capacitor. In order to compensate for this reduction in capacitance, there is suggested a method in which a dielectric layer with a high dielectric constant is used as the dielectric layer of a capacitor.

Figure 1:
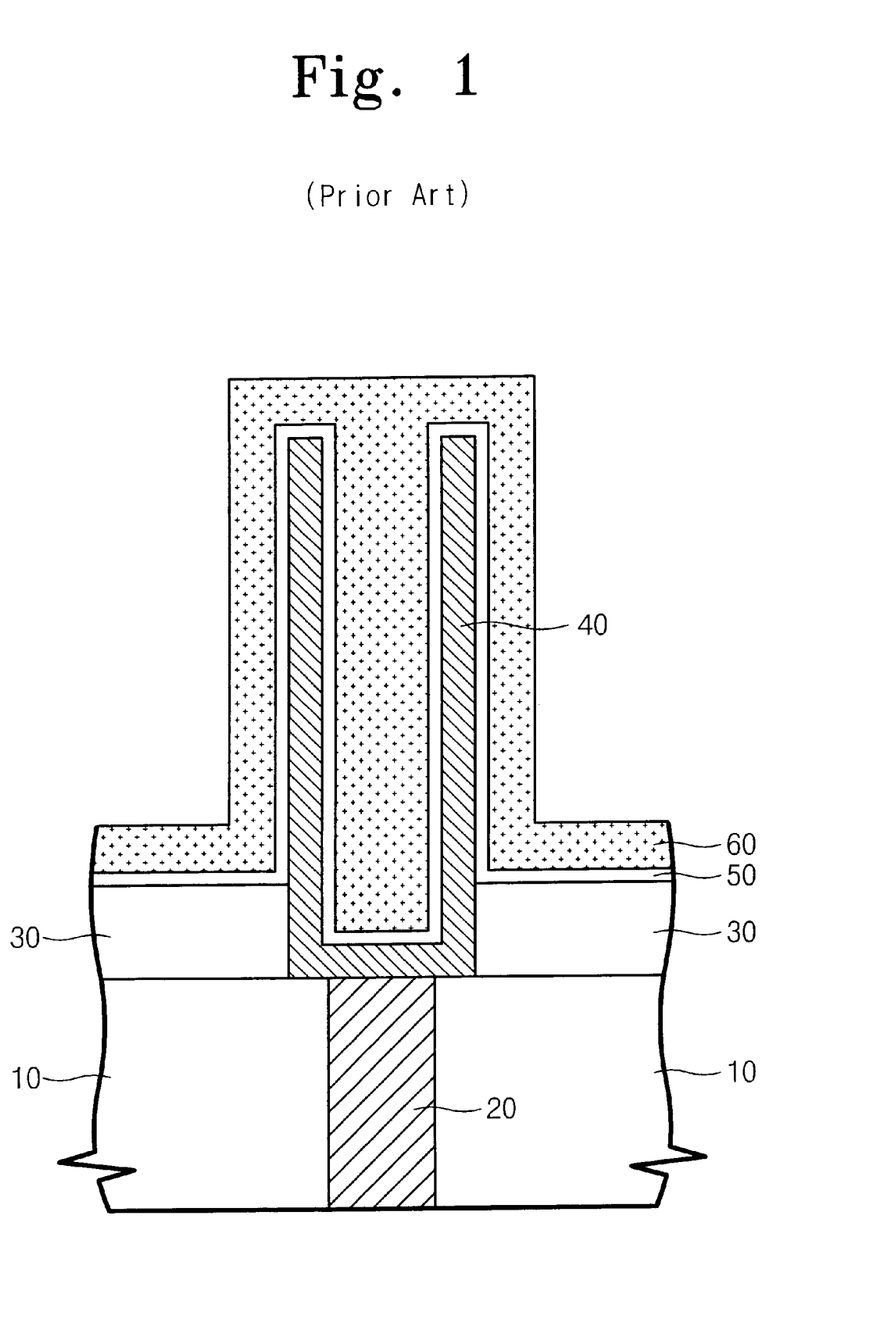
FIG. 1 illustrates a sectional view of a capacitor of a conventional semiconductor device.

FIG. 1 illustrates a sectional view of a cell capacitor of a general DRAM memory device.

Referring to FIG. 1, a lower electrode 40 of a circular pipe with a closed bottom surface is disposed on a predetermined region of a semiconductor substrate (not shown). An interlayer dielectric (ILD) 10 is disposed beneath the lower electrode 40 to cover the semiconductor substrate. In addition, a contact plug 20 is formed in the ILD 10 to be contacted with the bottom surface of the lower electrode 40.

A support pattern 30 is disposed on the ILD 10; the support pattern 30 has an upper surface lower than that of the lower electrode 40 and covers the outer wall of the lower portion of the lower electrode 40. An upper electrode 60 is disposed on the support pattern 30 to pass over the lower electrode 40.

A capacitor dielectric layer 50 is interposed between the upper electrode 60 and the lower electrode 40. Here, the capacitor dielectric layer 50 covers the surface of the lower electrode 40 at a uniform thickness and may extend to the upper surface of the support pattern 30.

Conventionally, the capacitor dielectric layer 50 is formed of at least one material selected from silicon oxide and silicon nitride. However, the dielectric constant of silicon oxide and silicon nitride is too low to overcome a reduction in capacitance caused by a conventional fabricating method as described above. To compensate for this reduction in capacitance, there is disclosed a technology in which an aluminum oxide layer and a titanium oxide layer having a high dielectric constant are used as the dielectric layer of a capacitor. However, if the aluminum oxide layer and the titanium oxide layer are used as a capacitor dielectric layer, the leakage current characteristic degenerates according to the temperature of a subsequent process.

Figure 2:
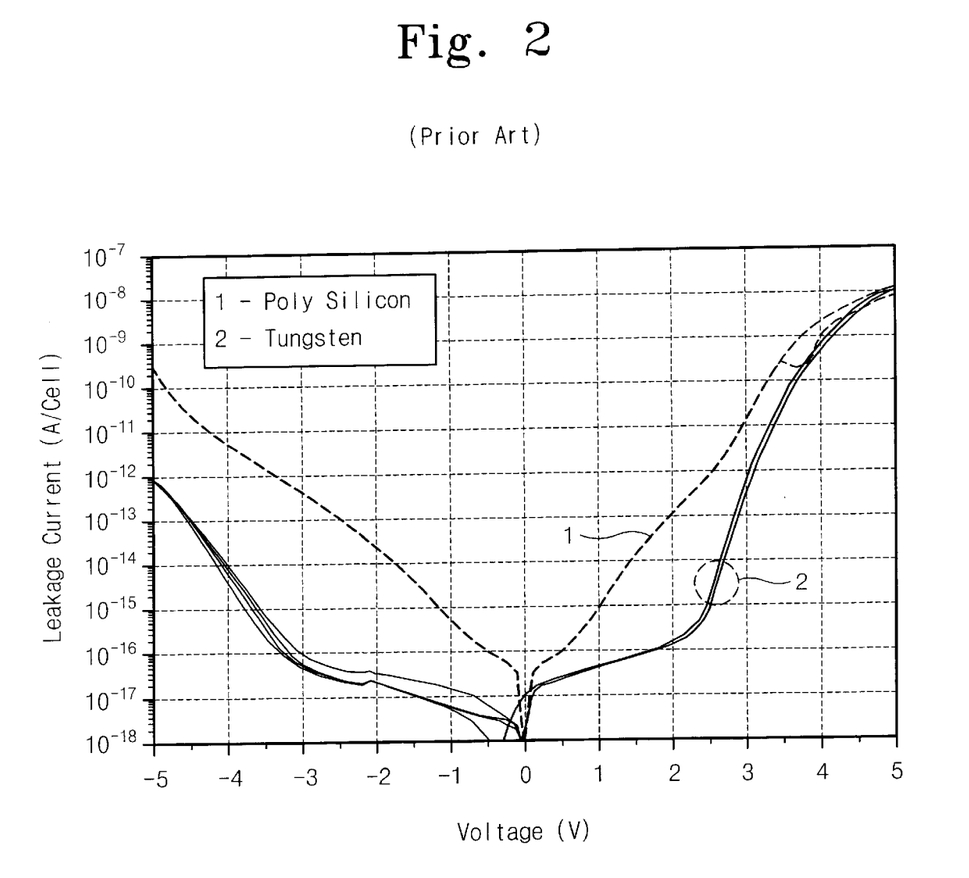
FIG. 2 is a graph illustrating leakage current characteristics of capacitors according to the material of the upper electrode.

FIG. 2 is a graph illustrating a relationship between a process temperature for forming an upper electrode of a capacitor and a leakage current characteristic of the capacitor for two capacitors having different upper electrodes.

Referring to FIG. 2, a sequentially stacked aluminum oxide layer and titanium oxide layer are used as the dielectric layer 50 of the capacitor described in FIG. 1. Here, the aluminum oxide layer and the titanium oxide layer are formed to have thicknesses of 40 Å and 50 Å, respectively. In addition, the upper electrode 60 is formed of polycrystalline silicon in trace 1 and tungsten in trace 2.

In the capacitor indicated by trace 2, the upper electrode of tungsten is formed by chemical vapor deposition (CVD) at a process temperature of 500° C. On the other hand, in the capacitor indicated by trace 1, the upper electrode of polycrystalline silicon is made by forming amorphous silicon by CVD and performing a thermal annealing to crystallize the amorphous silicon. Here, the thermal annealing is performed at 650° C.

When the upper electrode 60 is made of polycrystalline silicon, as illustrated by trace 1, the leakage current of the capacitor is measured 0.1 pA/Cell or more when an applied voltage is 2 V. On the other hand, when the upper electrode 60 is made of tungsten, as illustrated by trace 2, the leakage current of the capacitor is measured 0.1 fA/Cell or less under the same applied voltage. This difference between leakage currents is due to the difference in process temperatures at which the upper electrodes 60 are formed.

For convenience of a subsequent process, it is desirable that the upper electrode 60 be made of the polycrystalline silicon. It is generally well known that polycrystalline silicon is crystallized at 650° C. However, as described above, the thermal annealing temperature of 650° C. increases leakage current of the capacitor, which limits the use of polycrystalline silicon as the upper electrode 60.

SUMMARY OF THE INVENTION

Accordingly, the present invention is directed to a method of fabricating a capacitor of a semiconductor device that substantially obviates one or more problems due to limitations and disadvantages of the prior art.

A feature of an embodiment of the present invention is to provide a method of fabricating a capacitor of a semiconductor device in which leakage current is minimized.

To provide a feature of an embodiment of the present invention, a method of fabricating a capacitor of a semiconductor device is provided, including forming a lower electrode on a semiconductor substrate; forming an aluminum oxide layer on the lower electrode; forming a titanium oxide layer on the aluminum oxide layer; and forming an upper electrode crossing over the lower electrode on the titanium oxide layer, wherein the aluminum oxide layer is formed to have a thickness in a range of from about 35 Å to about 60 Å, the titanium oxide layer is formed to have a thickness in a range of from about 2 Å to about 50 Å, and the upper electrode is formed at a temperature in a range of from about 150° C. to about 630° C.

Preferably, an upper limit of the temperature range at which the upper electrode is formed is decreased as the thickness of the titanium oxide layer is increased.

Preferably, the aluminum oxide layer is formed by one of a chemical vapor deposition and an atomic layer deposition. The titanium oxide layer is preferably formed by one of a chemical vapor deposition and an atomic layer deposition. Here, the aluminum oxide layer is formed preferably to a thickness of at least 35 Å.

It is desirable that the upper electrode is formed of at least one material selected from the group consisting of titanium nitride, polycrystalline silicon, tungsten, aluminum and platinum group elements.

Preferably, forming the upper electrode includes sequentially forming an adhesive conductive layer and an upper conductive layer on the titanium oxide layer and sequentially patterning the upper conductive layer and the adhesive conductive layer. The adhesive conductive layer may be a crystalline conductive layer, preferably a titanium nitride layer. In addition, it is desirable that the upper conductive layer is formed of at least one material selected from the group consisting of polycrystalline silicon, tungsten, aluminum and platinum group elements.

Forming the upper conductive layer of polycrystalline silicon may include forming a silicon layer on the adhesive conductive layer by chemical vapor deposition and thermally annealing the silicon layer to crystallize the silicon layer at a temperature in a range of from about 550° C. to about 630° C. The adhesive conductive layer and the upper conductive layer are preferably formed by one process selected from the group consisting of an atomic layer deposition, a chemical vapor deposition and a physical vapor deposition.

In general, a heat treatment may be performed after forming the upper electrode. The heat treatment may be performed at a temperature in a range of from about 500° C. to about 630° C. The upper limit of the temperature range at which the heat treatment is performed is preferably decreased as the thickness of the titanium oxide layer is increased.

Specifically, the heat treatment may be performed at a temperature below 630° C. when the thickness of the titanium oxide layer is in a range of from about 2 Å to about 10 Å, below 600° C. when the thickness of the titanium oxide layer is in a range of from about 10 Å to about 20 Å, below 580° C. when the thickness of the titanium oxide layer is in a range of from about 20 Å to about 30 Å, and below 550° C. when the thickness of the titanium oxide layer is in a range of from about 30 Å to about 50 Å.

BRIEF DESCRIPTION OF THE DRAWINGS

The above features and advantages of the present invention will become more apparent to those of ordinary skill in the art by describing in detail preferred embodiments thereof with reference to the attached drawings in which.

DETAILED DESCRIPTION OF THE INVENTION

Korean Patent Application No. 10-2002-18447, filed on Apr. 4, 2002, and entitled: "Method of Fabricating a Capacitor of a Semiconductor Device" is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like numbers refer to like elements throughout.

Figure 3A:
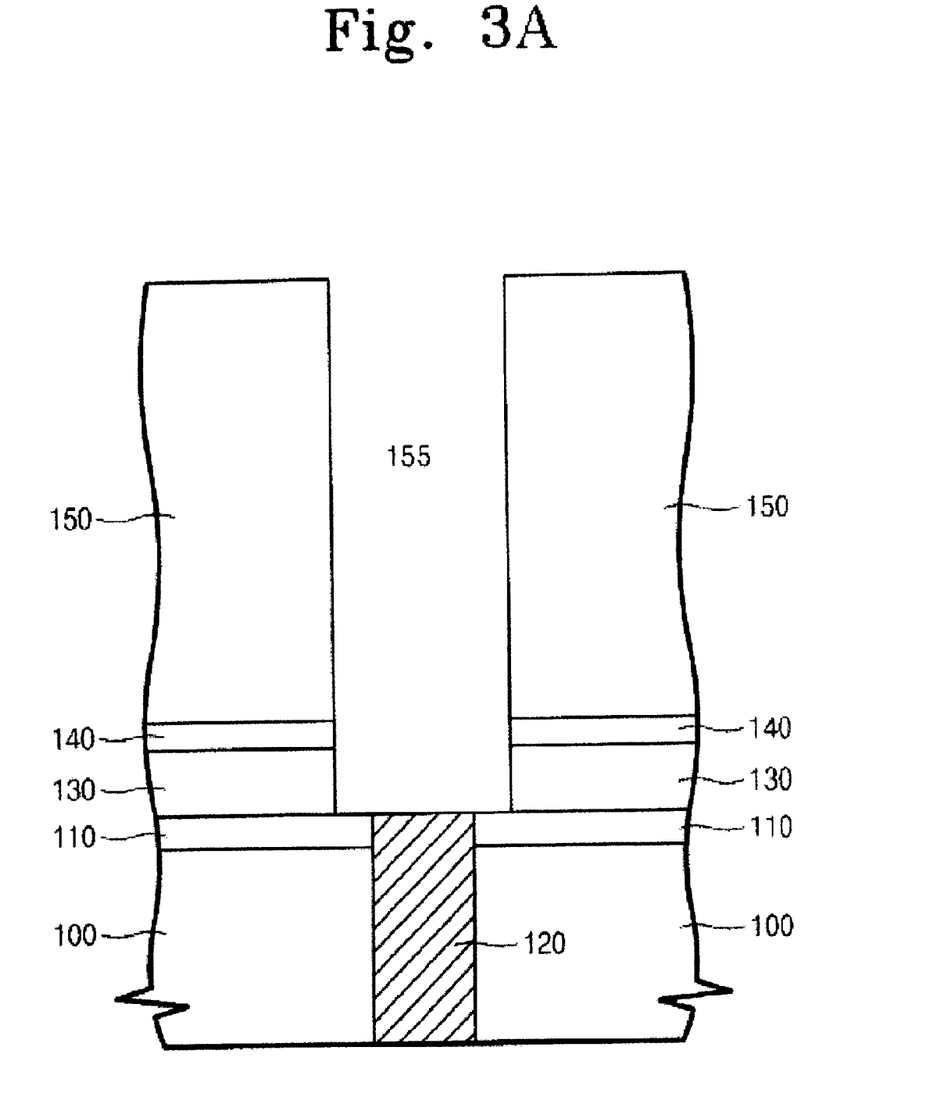
FIGS. 3 through 5 illustrate cross sectional views of a method of fabricating a capacitor of a semiconductor device according to a preferred embodiment of the present invention.
Figure 3B:
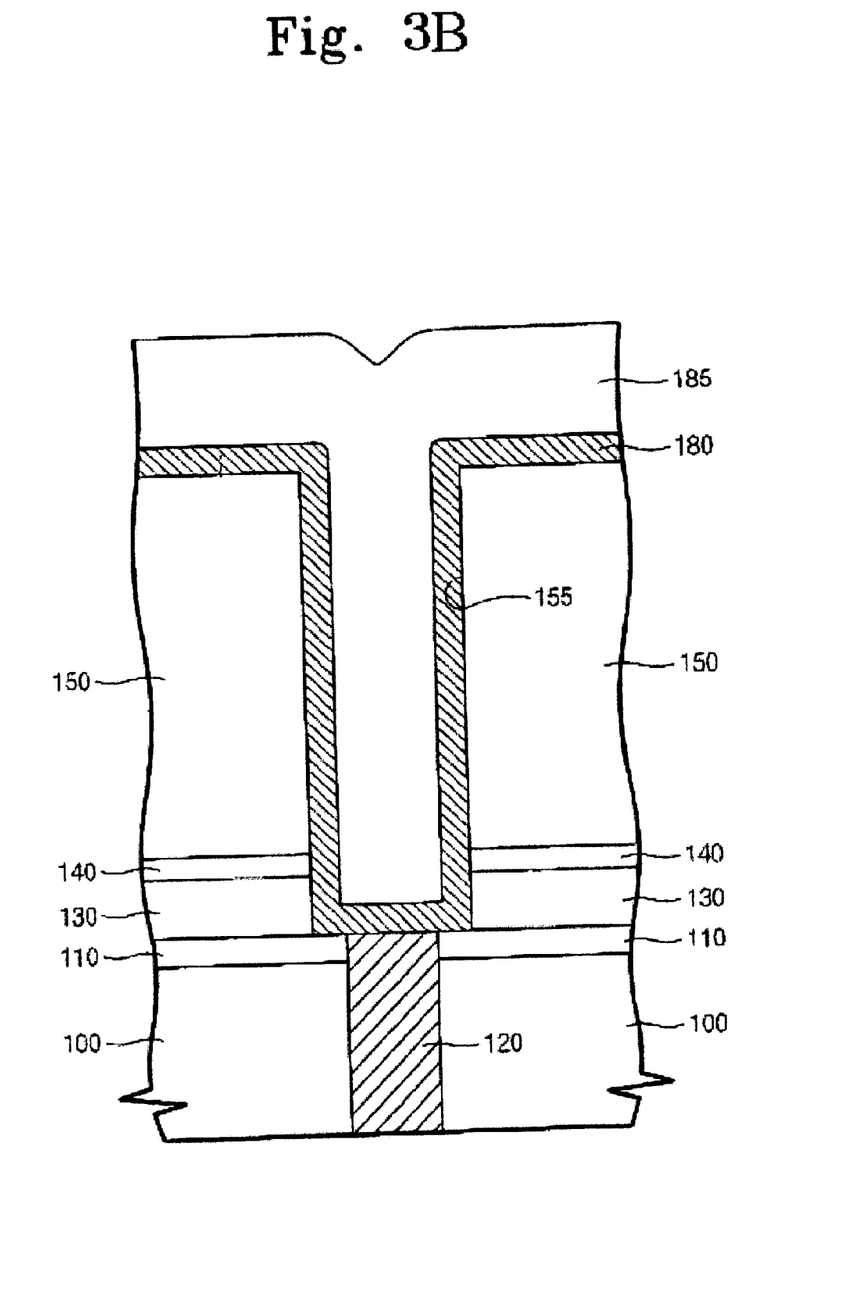
Figure 4:
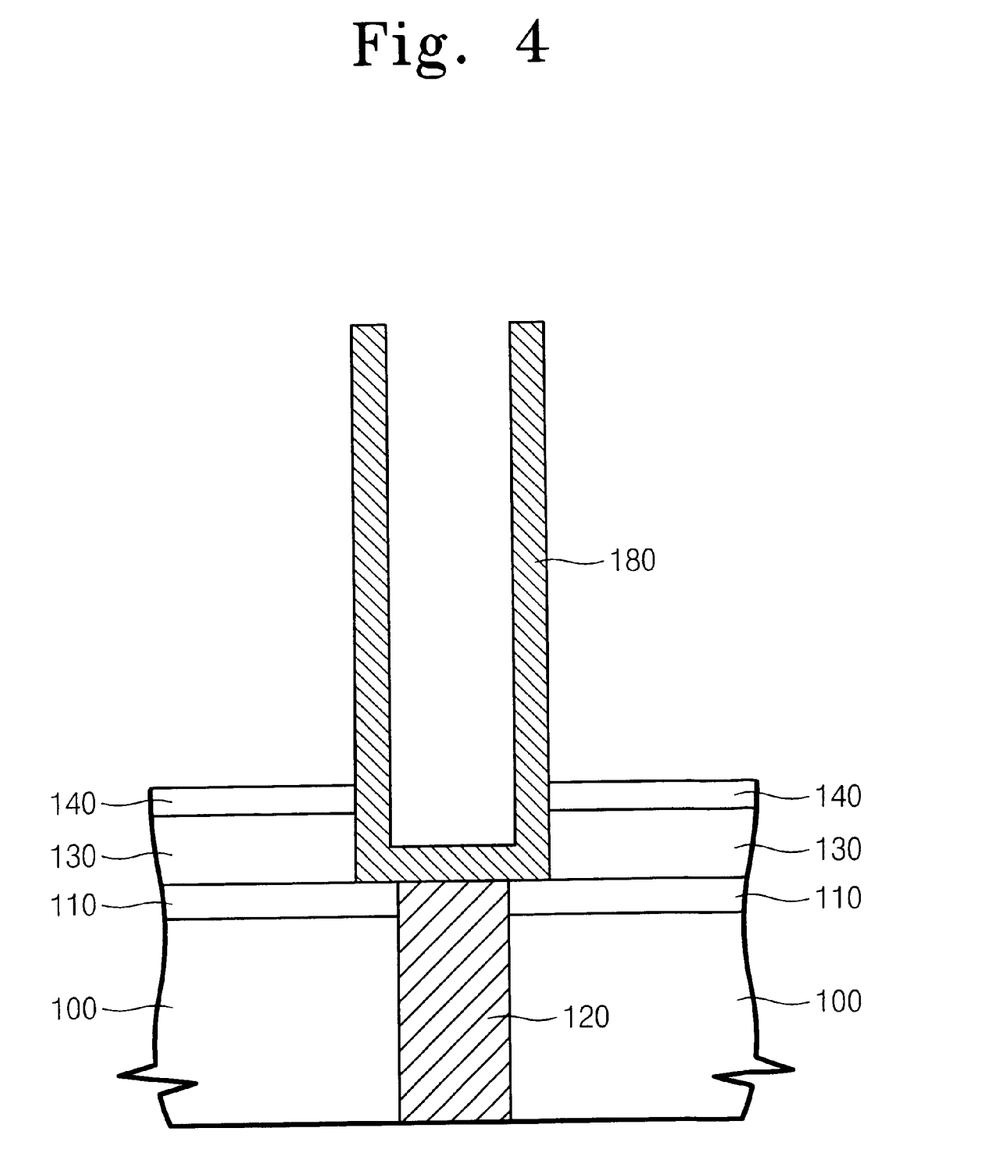

FIGS. 3 through 5 illustrate sectional views of a method of fabricating a capacitor of a semiconductor device according to a preferred embodiment of the present invention.

Referring to FIG. 3A, an interlayer dielectric (ILD) 100 and a lower etch stop layer 110 are sequentially formed on a semiconductor substrate (not shown in drawings). The ILD 100 covers a field oxide layer (not shown) and a gate pattern (not shown) formed by a conventional process. After that, there is formed a conductive contact plug 120 penetrating the lower etch stop layer 110 and the ILD 100.

Next, a supporting layer 130, an etch stop layer 140 and a molding layer 150 are sequentially formed on the entire surface of the semiconductor substrate including the contact plug 120. The molding layer 150, the etch stop layer 140 and the supporting layer 130 are used as material layers and act as a molding flask for determining the appearance of a lower electrode in a subsequent lower electrode forming process. The molding layer 150, the etch stop layer 140 and the supporting layer 130 are sequentially patterned to form an opening 155 exposing an upper surface of the contact plug 120. An etching process to form the opening 155 is performed on the etch stop layer 140 and the contact plug 120 by an anisotropic etching method in which an etching recipe having an etch selectivity with respect to the lower etch stop layer 110 and the contact plug is used.

Referring to FIG. 3B, a lower conductive layer 180' and a sacrificial layer 185 are formed on the entire surface of the semiconductor substrate having the opening 155. Afterwards, the lower conductive layer 180' and the sacrificial layer 185 are planarization-etched until the molding layer 150 is exposed, so that a sacrificial pattern (not shown) and a lower electrode 180, illustrated in FIG. 4, are formed.

It is desirable that the planarization etching process is performed by chemical mechanical polishing (CMP). Accordingly, as illustrated in FIG. 4, the lower electrode 180 covers an inner wall of the opening 155 of FIGS. 3A and B, and the sacrificial pattern (not shown) fills the inside of the lower electrode 180. Accordingly, the lower electrode 180 has a circular pipe structure of which a lower surface is closed and the sacrificial pattern (not shown) has a columnar structure filling the lower electrode 180.

By using an etch recipe that has an etch selectivity with respect to the lower electrode 180 and the etch stop layer 140, the molding layer 150 of FIGS. 3A and B and the sacrificial pattern are removed. The removing process is performed by an isotropic etching, preferably, a wet etching. Usually, since the molding layer 150 and the sacrificial pattern are formed of an oxide layer, an etchant containing hydrogen fluoride (HF) is preferably used in the removing process. Accordingly, the etch stop layer 140 and the lower electrode 180 are exposed.

Figure 5A:
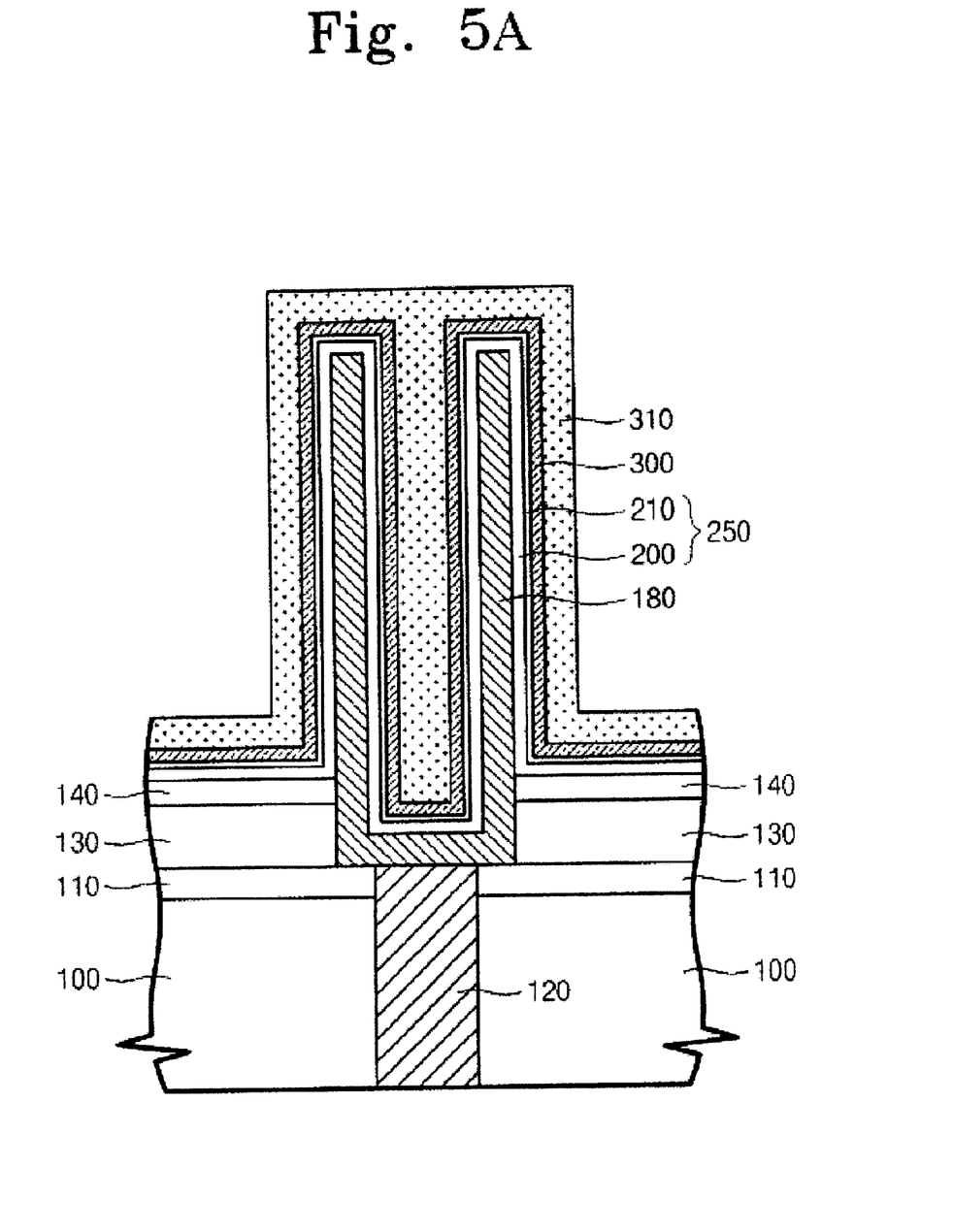

Referring to FIG. 5A, a capacitor dielectric layer 250 is formed on the entire surface of the semiconductor substrate from which the molding layer 150 and the sacrificial pattern are removed.

As previously described, it is required to secure the capacitance of the capacitor due to a reduction in the area of the capacitor. To this end, the capacitor dielectric layer 250 is formed of a sequentially stacked aluminum oxide layer 200 and a titanium oxide layer 210. It is desirable that the aluminum oxide layer 200 and the titanium oxide layer 210 are formed by chemical vapor deposition or atomic layer deposition.

The aluminum oxide layer 200 and the titanium oxide layer 210 have a higher dielectric constant than a silicon oxide layer commonly used in the related art. The aluminum oxide layer 200 has a great band gap and a superior characteristic in preventing current leakage, but its dielectric constant is lower than that of the titanium oxide layer 210. Conversely, although the titanium oxide layer 210 has a higher dielectric constant than the aluminum oxide layer 200, the ability of the titanium oxide layer 210 to prevent current leakage is inferior to that of the aluminum oxide layer 200.

However, the combination of the aluminum oxide layer 200 and the titanium oxide layer 210 as the capacitor dielectric layer 250 is better than either the aluminum oxide layer 200 or the titanium oxide layer 210 alone when considering both the leakage current characteristic and the capacitance.

Figure 6:
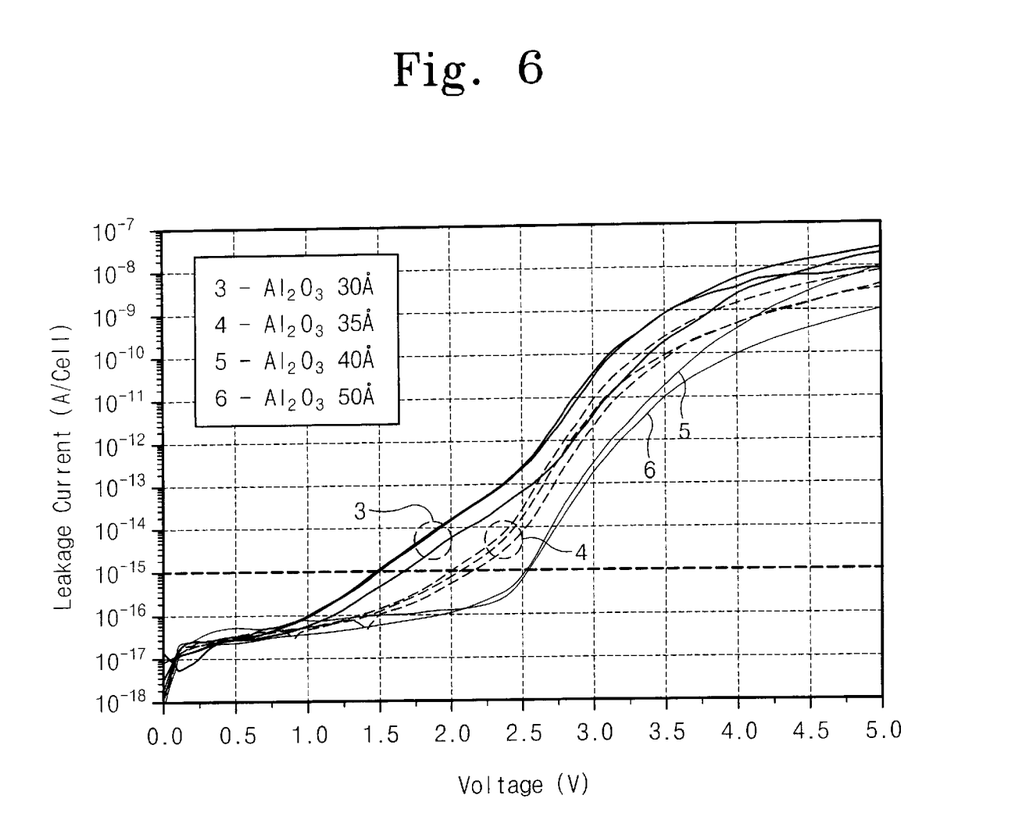
FIG. 6 is a graph illustrating leakage current characteristics of the capacitor of FIGS. 3 through 5 according to the thickness of aluminum oxide layer.

Referring to FIG. 6, leakage current is measured with respect to changes in thickness of the aluminum oxide layer 200 and the titanium oxide layer 210.

As illustrated by trace 3, when the aluminum oxide layer 200 is 30 Å and the applied voltage is 2 V, the leakage current per unit cell is 1 fA/Cell or more, regardless of the thickness of the titanium oxide layer 210, which is changed to 30, 50 or 70 Å.

On the other hand, as illustrated by trace 4, when the thickness of the aluminum oxide layer 200 is 35 Å and the applied voltage is 2 V, the leakage current per unit cell is about 1 fA/Cell or less (4). In this case, the thickness of the titanium oxide layer 210 that is changed to 30, 50 or 70 Å influences the amount of leakage current but the influence is negligible.

If the thickness of the aluminum oxide layer 200 is 40 Å and the thickness of the titanium oxide layer 210 is 50 Å, as illustrated by trace 5, the leakage current per unit cell is about 0.1 fA/Cell at the applied voltage of 2 V.

Additionally, when the thickness of the aluminum oxide layer 200 is 50 Å with no titanium oxide layer 210 as illustrated by trace 6, and the applied voltage is 2 V, the leakage current per unit cell is 0.1 fA/Cell. This is a similar result to the case illustrated by trace 5, when the thickness of the aluminum oxide layer 200 is 40 Å and the thickness of the titanium oxide layer is 50 Å. This result implies that the thickness of the aluminum oxide layer 200 may be reduced when the titanium oxide layer 210 is used as the capacitor dielectric layer 250. In other words, duplicate layers including the titanium oxide layer 210 may prevent leakage current more effectively than when only the aluminum oxide layer 200 is used.

However, it is desirable that the leakage current of the capacitor dielectric layer 250 be 1 fA/Cell or less. Accordingly, it is desirable that the thickness of the aluminum oxide layer 200 be at least 35 Å or more.

Referring to FIG. 5A again, an adhesive conductive layer 300 is formed on the capacitor dielectric layer 250. The adhesive conductive layer 300 is formed of a crystalline conductive material layer, preferably a titanium nitride layer. An upper conductive layer 310 is formed on the entire surface of the semiconductor of the adhesive conductive layer 300. The upper conductive layer 310 is formed of at least one material selected from the group consisting of polycrystalline silicon, tungsten, aluminum and platinum group elements.

The adhesive conductive layer 300 is a material to improve the adhesive force between the capacitor dielectric layer 250 and the upper conductive layer 310 and to prevent an undesired reaction between them. To achieve this, as described above, the adhesive conductive layer 300 is formed of a titanium nitride layer that has a superior adhesive force compared with a silicon nitride layer and a silicon oxide layer.

As previously described, the high temperature process applied when forming the upper electrode causes the leakage current of the capacitor to increase. Accordingly, it is desirable that the process of forming the adhesive conductive layer 300 and the upper conductive layer 310 is performed in a temperature range of 150° C. to 630° C.

When the titanium nitride layer formed by CVD is used as the adhesive conductive layer 300, the process temperature is usually about 300° C. In addition, when a metal such as tungsten, aluminum or a platinum group element is used as the upper conductive layer 310, the temperature is usually in a range of from about 300° C. to about 500° C. When using physical deposition, the temperature may be reduced further.

When polycrystalline silicon is used as the upper conductive layer, the upper conductive layer is formed by CVD. The process of forming the polycrystalline silicon layer according by CVD includes forming an amorphous silicon layer on the adhesive conductive layer 300 and performing a heat treatment on the amorphous silicon layer to crystallize the amorphous silicon layer. Conventionally, a heat treatment to crystallize amorphous silicon is performed at 650° C., which is the well-known silicon crystallization temperature. However, as described above, when a process to form the upper conductive layer 310 is performed at 650° C., the leakage current of the capacitor increases. Accordingly, it is conventionally undesirable to use a polycrystalline silicon layer as the upper conductive layer 310.

However, as described above, when forming a polycrystalline silicon layer on the crystalline adhesive conductive layer 300, the temperature of the heat treatment for crystallization may be reduced. This phenomenon will be described in detail with reference to FIG. 7 based on measured experimental results.

Figure 7:
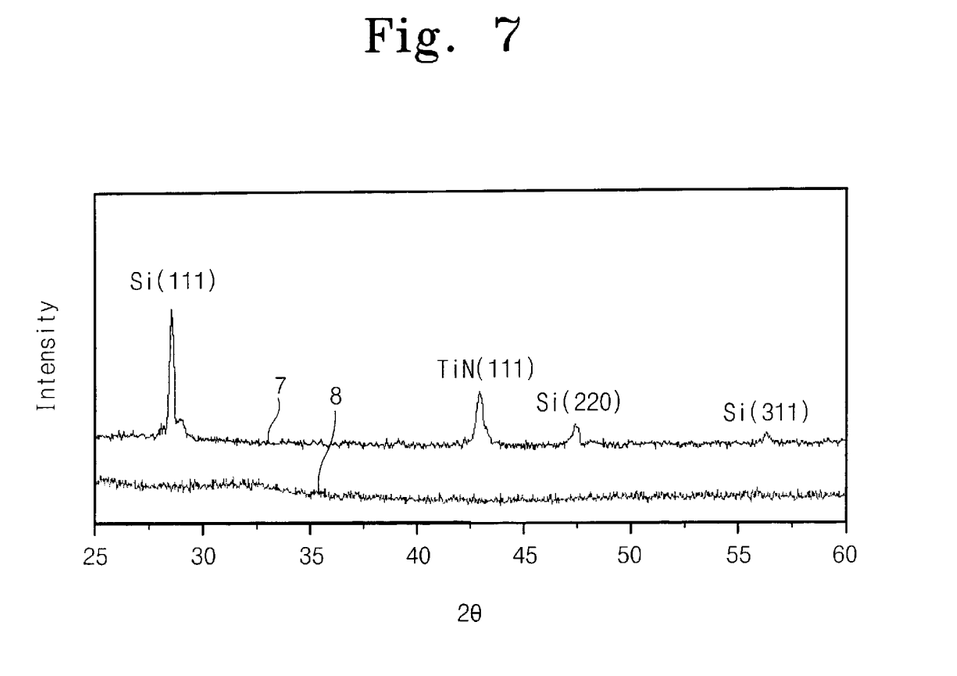
FIG. 7 is a graph illustrating an XRD analysis result to confirm the temperature at which a polycrystalline silicon layer is crystallized.

FIG. 7 is a graph illustrating an X-ray diffractometer (XRD) analysis result to determine whether a test material has a crystalline structure. The XRD analysis is used to analyze the X-ray diffracted from a test material in accordance with Bragg's law so that the phase and the crystal structure of the test material are found. When the test material is crystalline, constructive interference occurs in the X-ray in the direction of crystal corresponding to a predetermined Miller index. If the intensity of the diffracted X-ray is strengthened in the direction corresponding to constructive interference, a peak appears in the measured graph.

Referring to FIG. 7, amorphous silicon layers are formed on the silicon oxide layer and the titanium nitride layer, respectively, and a heat treatment is performed at 580° C. to the resultant structure. According to the result of the XRD analysis illustrated by trace 8, the silicon layer formed on the silicon oxide layer is not crystallized at 580° C. However, as illustrated by trace 7, it is confirmed that the silicon layer formed on the titanium nitride layer is crystallized at 580° C. The peak of the titanium nitride layer formed at 300° C. means that the titanium nitride layer is crystalline.

Referring to the results of the analysis, it may be considered that the amorphous silicon layer formed on the crystalline material layer is crystallized at a lower temperature than the amorphous silicon layer formed on a material layer that is not crystalline. Accordingly, by exploiting this phenomenon, the temperature of the heat treatment to crystallize the amorphous silicon may be lowered to 580° C. Therefore, an increase in the leakage current of the capacitor due to a heat treatment as previously described may be prevented.

Figure 5B:
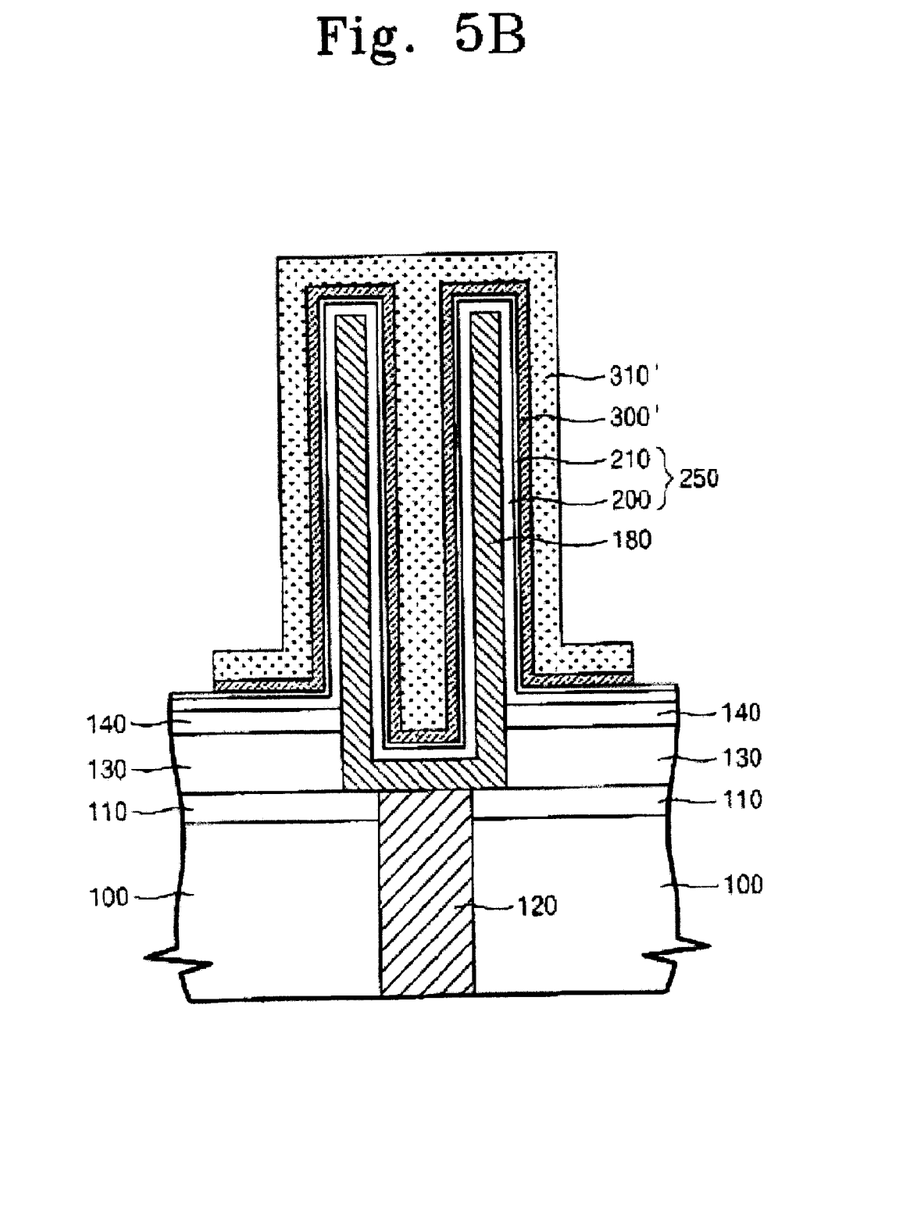

Referring to FIG. 5B, the upper conductive layer 310 and the adhesive conductive layer 300 are sequentially patterned to expose a portion of an upper surface of the capacitor dielectric layer 250 located on the etch stop layer 140. Accordingly, an upper electrode is formed comprising an adhesive pattern 300' and an upper conductive pattern 310' that passes over the lower electrode 180. Additionally, the capacitor dielectric layer 250 may be patterned during the patterning process to form the upper electrode.

It is desirable that the process temperature of the heat treatment to crystallize the amorphous silicon is controlled according to the thickness of the titanium oxide layer used as the capacitor dielectric layer 250.

Figure 8:
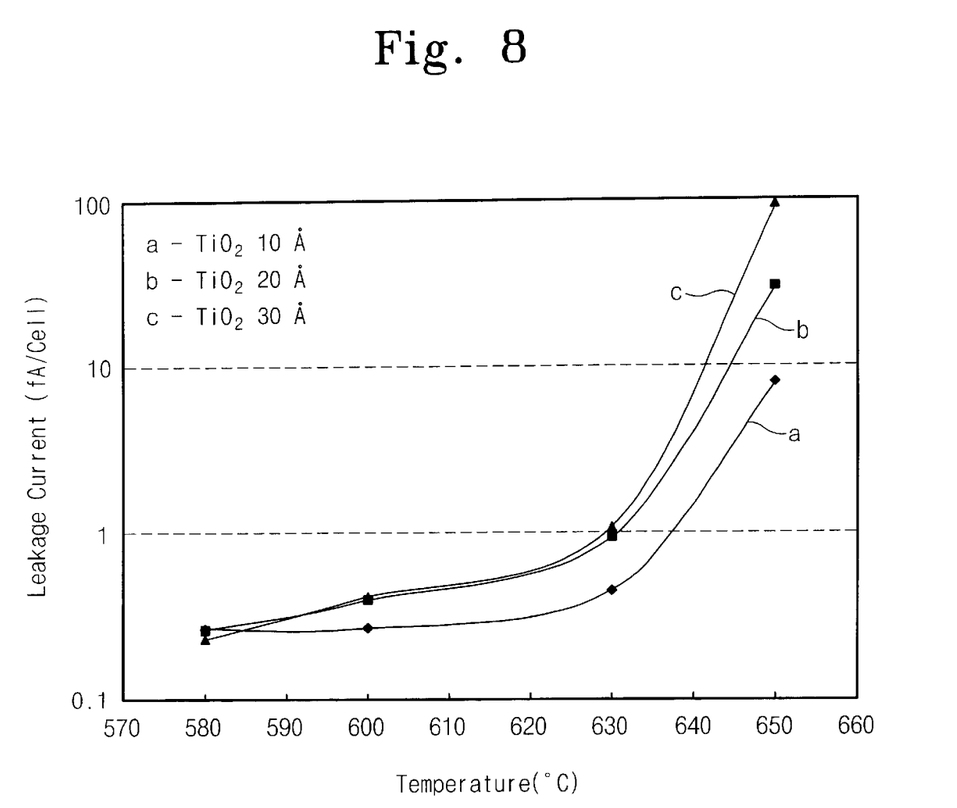
FIG. 8 is a graph illustrating leakage current characteristics of a capacitor of a semiconductor device according to the present invention, according to the thickness of a titanium oxide layer and the temperature of a subsequent thermal annealing.

FIG. 8 is a graph illustrating leakage current of a capacitor of a semiconductor device according to the thickness of the titanium oxide layer 210 and the temperature of a subsequent heat treatment.

Referring to FIG. 8, it is found that the leakage current increases as the thickness of the titanium oxide layer 210 increases when the temperature of the subsequent process performed after forming the titanium oxide layer 210 is from 600 to 650° C. Accordingly, it is desirable that the subsequent heat treatment is performed at a lower temperature when the titanium oxide layer 210 gets thicker.

As described in the description of FIG. 2, it is found that the leakage current increases rapidly when a subsequent process is performed at a temperature of 650° C. Accordingly, it is desirable that the subsequent process, including the upper electrode forming process, is performed at a temperature below 630° C. so that the preferred leakage current of the capacitor is less than 1 fA. However, as described above, it is desirable that the temperature of the subsequent process be reduced as the thickness of the titanium oxide layer increases. For example, it is desirable that the upper limit of the temperature range of the subsequent process is 630° C., 600° C., 580° C., or 550° C. when the thickness of the titanium oxide layer 210 is 10 Å, 20 Å, 30 Å or 50 Å, respectively.

When using the aluminum oxide layer 200 and titanium oxide layer 210 as a capacitor dielectric layer, the subsequent process including the upper electrode forming process should be performed at 630° C. or less. It is desirable that the upper limit of the temperature range of the subsequent process is reduced as the titanium oxide layer 210 gets thicker. When using a polycrystalline silicon layer as the upper conductive layer 310, the polycrystalline silicon layer is formed on the crystalline adhesive conductive layer 300 so that the temperature of heat treatment for crystallization can be reduced.

According to the present invention, there is provided a method of forming a capacitor of a semiconductor device that has a capacitor dielectric layer including an aluminum oxide layer and titanium oxide layer. Particularly, the present invention provides a method of forming a capacitor of a semiconductor device to minimize leakage current of the capacitor. By minimizing the leakage current of the capacitor, the manufacture of semiconductor devices that consume low power and have high performance is possible.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a capacitor of a semiconductor device, the method comprising:

forming a lower electrode on a semiconductor substrate;

forming an aluminum oxide layer on the lower electrode;

forming a titanium oxide layer on the aluminum oxide layer; and forming an upper electrode crossing over the lower electrode on the titanium oxide layer, wherein the aluminum oxide layer is formed to have a thickness in a range of from about 35 Å to about 60 Å, the titanium oxide layer is formed to have a thickness in a range of from about 2 Å to about 50 Å, and the upper electrode is formed at a temperature in a range of from about 150° C. to about 630° C.

2. The method as claimed in claim 1, wherein an upper limit of the temperature range at which the upper electrode is formed is decreased as the thickness of the titanium oxide layer is increased.

3. The method as claimed in claim 1, wherein the aluminum oxide layer is formed by one of a chemical vapor deposition and an atomic layer deposition.

4. The method as claimed in claim 1, wherein the titanium oxide layer is formed by one of a chemical vapor deposition and an atomic layer deposition.

5. The method as claimed in claim 1, wherein the upper electrode is formed of at least one material selected from the group consisting of titanium nitride, polycrystalline silicon, tungsten, aluminum and platinum group elements.

6. The method as claimed in claim 1, wherein forming the upper electrode comprises:

sequentially forming an adhesive conductive layer and an upper conductive layer on the titanium oxide layer; and sequentially patterning the upper conductive layer and the adhesive conductive layer.

7. The method as claimed in claim 6, wherein the adhesive conductive layer is a crystalline conductive layer.

8. The method as claimed in claim 6, wherein the adhesive conductive layer is a titanium nitride layer.

9. The method as claimed in claim 6, wherein the upper conductive layer is formed of at least one material selected from the group consisting of polycrystalline silicon, tungsten, aluminum and platinum group elements.

10. The method as claimed in claim 9, wherein forming the upper conductive layer of polycrystalline silicon comprises:

forming a silicon layer on the adhesive conductive layer by chemical vapor deposition; and thermally annealing the silicon layer to crystallize the silicon layer at a range of from about 550° C. to about 630° C.

11. The method as claimed in claim 6, wherein the adhesive conductive layer and the upper conductive layer are formed by one selected from the group consisting of an atomic layer deposition, a chemical vapor deposition and a physical vapor deposition.

12. The method as claimed in claim 1, further comprising performing a heat treatment after forming the upper electrode.

13. The method as claimed in claim 12, wherein the heat treatment is performed at a temperature in a range of from about 500° C. to about 630° C.

14. The method as claimed in claim 12, wherein an upper limit of the temperature range at which the heat treatment is performed is decreased as the thickness of the titanium oxide layer is increased.

15. The method as claimed in claim 12, wherein the heat treatment is performed at a temperature below 630° C. when the thickness of the titanium oxide layer is in a range of from about 2 Å to about 10 Å.

16. The method as claimed in claim 12, wherein the heat treatment is performed at a temperature below 600° C. when the thickness of the titanium oxide layer is in a range of from about 10 Å to about 20 Å.

17. The method as claimed in claim 12, wherein the heat treatment is performed at a temperature below 580° C. when the thickness of the titanium oxide layer is in a range of from about 20 Å to about 30 Å.

18. The method as claimed in claim 12, wherein the heat treatment is performed at a temperature below 550° C. when the thickness of the titanium oxide layer is in a range of from about 30 Å to about 50 Å.

* * * * *